Dec. 16, 1969 G. L. BABCOCK 3,484,867

THERMALLY STABILIZED CLASS A OR CLASS B COMPLEMENTARY TRANSISTOR PUSH-PULL AMPLIFIER

Filed May 2, 1968

INVENTOR.
GORDON L. BABCOCK

BY

Roland A. Anderson

ATTORNEY

United States Patent Office 3,484,867
Patented Dec. 16, 1969

3,484,867

THERMALLY STABILIZED CLASS A OR CLASS B COMPLEMENTARY TRANSISTOR PUSH-PULL AMPLIFIER

Gordon L. Babcock, Menlo Park, Calif., assignor to the United States of America as represented by the United States Atomic Energy Commission Filed May 2, 1968, Ser. No. 726,006
Int. Cl. H03f *3/18*
U.S. Cl. 330—13 10 Claims

ABSTRACT OF THE DISCLOSURE

An amplifier including a pair of complementary emitter follower stages that are diode stabilized to prevent thermal runaway, and that are each provided with individual quiescent current paths from opposing power supply busses. This permits substantially equal quiescent voltages, independent of quiescent current to the stages, to be established and maintained at the opposite ends of the stabilizing diodes so that small bypass resistors can be placed across the diodes for conducting small signal load currents, especially during transition of conduction from one stage to the other prior to forward conduction of load currents through the diodes.

BACKGROUND OF THE INVENTION

The present invention relates ot transistorized power amplifiers, and more particularly, it pertains to a thermally stabilized transistorized push-pull power amplifier that exhibits low distortion and that may be biased either Class A or Class B.

The invention disclosed herein was made under, or in, the course of Contract No. AT(04–3)—400 with the United States Atomic Energy Commission.

Four persistent problems in the design of transistorized push-pull power amplifiers are (1) freedom to bias such amplifiers Class B (slight quiescent conduction so that each transistor stage responds immediately to the corresponding input signal) or to bias the amplifier Class A (sufficient quiescent conduction so that the transistors are always conducting in the linear region); (2) to minimize crossover distortion; (3) to stabilize the amplifier against thermal runaway during quiescent or small signal conditions; and (4) to provide designs that do not require a critical selection of components. Known solutions to these problems have not heretofore resulted in circuits in which all of the problems are definitely and simultaneously solved. Thermal stabilization of such amplifiers is necessary due to thermal variations of transistor junction voltages. Stabilization is generally provided by placing bias voltages under control of devices which have negative voltage temperature coefficients corresponding to the negative voltage temperature coefficients of transistor junctions. Such devices provide the required thermal stabilization, but the conventional ways that they are used in push-pull amplifiers result in compromise designs that do not satisfactorily and simultaneously solve the problems of thermal runaway, crossover distortion, restricted class of operation, and critical selection of components.

SUMMARY OF THE INVENTION

In brief, the present invention provides independent current paths for quiescent current to opposing stages of a thermally stabilized push-pull transistorized power amplifier, the level of the quiescent current being set for Class A or Class B operation without dependence on a critical selection of values for the amplifier components. Stabilizing diodes are serially connected between opposing emitter follower stages of the amplifier and equal bias voltages are maintained across the diodes so that no quiescent current can flow through the diodes to the amplifier stages. To minimize crossover distortion introduced by the diodes, resistors are placed in parallel with the diodes for conducting load currents for output signals that are below the level required to initiate forward diode conduction. Since no significant quiescent current can flow through the parallel resistors, their value may be selected independently of the quiescent current paths, and conversely, the quiescent current paths may be established independently of the parallel resistors. This invention permits a push-pull transistorized power amplifier to be stably biased at any point, and in particular, permits Class A or Class B operation with exceptionally low crossover distortion and high power efficiency without requiring critical selection of components.

It is an object of the invention to provide a thermally stabilized transistorized push-pull power amplifier that may be designed without a critical selection of components for Class A or Class B operation with exceptionally low crossover distortion and high power efficiency.

Other objects and advantageous features of the invention will be apparent in a description of an embodiment, given by way of example only, to enable one skilled in the art to readily practice the invention, and described hereinafter with reference to the accompanying drawing.

DESCRIPTION OF AN EMBODIMENT

Figure 1:
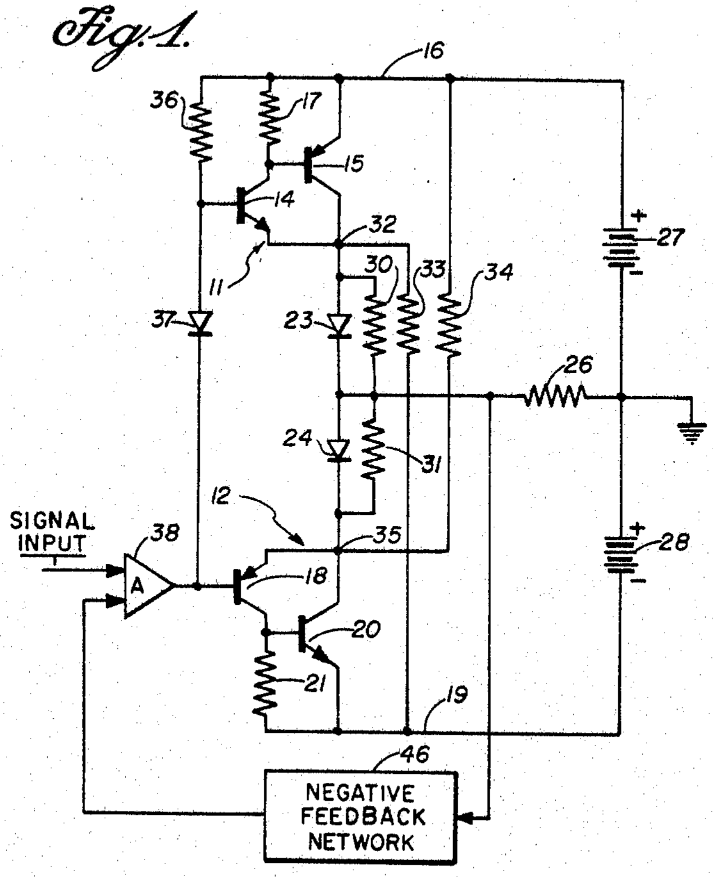
FIGURE 1 is a schematic diagram of a transistorized push-pull power amplifier according to the invention.

Referring to the drawing there is shown in FIGURE 1 a transistorized push-pull power amplifier comprising a pair of complementary emitter follower stages 11 and 12. The stage 11 includes a driving transistor 14 having its emitter and collector bootstrapped across the base and emitter of a PNP power output transistor 15 whose emitter is connected to a positive power supply bus 16. A biasing resistor 17 is connected across the emitter and base of the transistor 15. The stage 12 is complementary and symmetric with the stage 11 and includes a driving transistor 18 having its emitter and collector bootstrapped across the emitter and base of an NPN power output transistor 20 whose emitter is connected to a negative power supply bus 19. A biasing resistor 21 is connected across the emitter and base of the transistor 20. A pair of stabilizing diodes 23 and 24 are serially connected in the forward direction with the stages 11 and 12 across the power supply busses 16 and 19. One end of a load impedance 26 is connected to the junction of the diodes 23 and 24 while the other end of the impedance is connected to a grounded midpoint of the power supply which is comprised of equal power sources 27 and 28 connected such that the bus 16 is positive with respect to ground while the bus 19 is negative with respect to ground. Resistors 30 and 31 are connected respectively across the diodes 23 and 24 for conducting small signal load currents at and near the zero crossover point, prior to forward breakdown and full conduction of the respective diodes 23 and 24.

Independent quiescent current conduction means for the stage 11 is provided by connecting a resistor 33 from the negative bus 19 to a common point 32 of the emitter of transistor 14 and collector of transistor 15. Quiescent current for the stage 12 is provided by means of a resistor 34 connected between the positive bus 16 and a common point 35 of the emitter of transistor 18 and the collector of transistor 20.

The voltage applied to the bases of the driving transistors 14 and 18 are set by a voltage division network comprising a resistor 36, serially connected with a compensating diode 37 and the output impedance of a preamplifier 38.

These voltages are set such that the bases of the transistors 14 and 18 are near ground potential but separated by the forward voltage drop of the diode 37. The negative potential of the bus 19 is applied through the resistor 33 to the emitter of the transistor 14. Since the base of the transistor 14 is near ground potential, the base-emitter junction is forward biased, causing forward conduction of the transistor 14 under quiescent conditions from the positive bus 16, the biasing resistor 17, and the resistor 38 to the negative bus 19. This conduction causes a forward bias across the base-emitter junction of the transistor 15, causing forward conduction therethrough from the bus 16 through the resistor 33 to the negative bus 19.

The value chosen for the biasing resistor 17 determines the quiescent current of transistor 14, while the value chosen for the resistor 33 primarily determines the quiescent current of transistor 15. Because the output of the transistor 14 is amplified by transistor 15, the collector current of transistor 14 can be chosen to be very low relative to the collector current of transistor 15 and still give a substantial output signal from transistor 15. The quiescent current to transistor 14 therefore may be made to constitute a very small percentage of the total current through resistor 33. Under such conditions, the quiescent current levels of transistors 14 and 15 are essentially mutually independent. The valves of resistors 17 and 33 therefore may be selected independently within a wide range to obtain the desired quiescent current levels without causing any significant interaction therebetween.

The previously mentioned forward bias of the base-emitter junction of the transistor 14 results in a voltage drop thereacross which places the emitter of transistor 14 near ground potential, causing either a slight reverse bias across the diode 23 or a slight forward bias; but in either case, the bias voltage level will be below the level required for forward conduction of the diode.

In a manner similar to that described for stage 11 quiescent current is supplied to the stage 12 through the resistor 34, causing a drop across the emitter-base junction of transistor 18, thereby placing the voltage of the emitter of transistor 18 near ground, at a level that prevents forward conduction of the diode 24.

The biasing of the diodes 23 and 24 can result in only very small quiescent currents through the resistors 30 and 31. When present, these currents are equal and opposite, thereby causing a net zero quiescent voltage across the load impedance 26.

Since, as previously mentioned, the quiescent voltage drops across the diodes 23 and 24 and resistors 30 and 31 are near zero, there can be only an insignificant quiescent current flow through the resistors 30 and 31 and no flow through the diodes 23 and 24. The resistors 33 and 34 therefore constitute virtually the sole path for quiescent current to the stages 11 and 12. The values for the resistors 30 and 31 thus may be selected independently of the values selected for the resistors 33 and 34. The resistors 33 and 34, for example, may be selected for Class A or Class B operation of the amplifier while the resistors 30 and 31 may be selected to give minimum crossover distortion and best power efficiency. This independence also makes the selections noncritical.

Thus, as discussed, the quiescent currents of transistors 14, 15, 18, and 20 may be set independently by noncritical selection of values for resistors 17, 33, 21, and 34 respectively.

Due to the bootstrap connection of transistor 14 across transistor 15 of stage 11, any quiescent voltage variations across the base-emitter junctions of either of the transistors, such as due to imperfect tracking of the diode and transistor junction, causes a shift of quiescent current from one transistor to the other. However, the total quiescent current to stage 11 remains constant. Similarly, the total quiescent current to stage 12 remains constant. The quiescent current through the resistors 33 and 34 and therefore the voltage thereacross also remains constant, thereby further stabilizing the quiescent operating conditions of the amplifier.

The diode 37 may be included in the input voltage biasing network to compensate for the output signal distortiton that is introduced by the presence of the stabilizing diodes 23 and 24. The diode 37 reduces this distortion by bringing the quiescent voltage drop across the diodes 23 and 24 nearer to the level required to initiate conduction therethrough. The diode 37 also has a negative voltage temperature coefficient corresponding to the negative voltage temperature coefficients of the transistors 14 and 18 and the diodes 23 and 24, thereby stabilizing the quiescent voltage across the diodes 23 and 24, over a wide temperature operating range.

Figure 2:
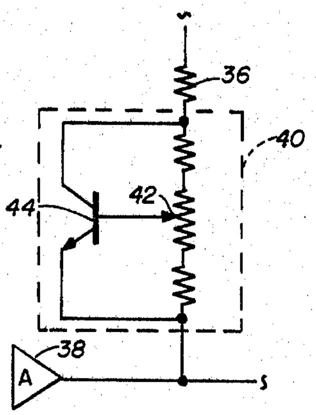
FIGURE 2 is a schematic diagram of an adjustable impedance for setting the zero axis crossover point of the amplifier in FIGURE 1.

An adjustable impedance 40 (FIGURE 2) can be inserted between the resistor 36 and preamplifier 38 in place of the diode 37. The impedance 40 is comprised of a potentiometer 42 for supplying a variable bias voltage to the base of a transistor 44 having its emitter and collector connected across the potentiometer. The voltage drop across the impedance 40 is not limited to discrete increments of voltage drops, as exhibited by a variable number of series diodes, but is more precisely selectable by action of the potentiometer 42.

In operation, a positive signal applied from the preamplifier 38 to the bases of the transistors 14 and 18 causes the transistor 18 to become reversed biased and to cut off, while the transistor 14 becomes forward biased and conducts proportionally for driving the power output transistor 15. At small positive signal levels, less than the voltage required to initiate forward conduction through the diode 23, the current is conducted from the transistors 14 and 15 through the resistor 30 to the load impedance 26. At higher positive signal levels, sufficient to initiate forward conduction of the diode 23, current will be conducted from the transistors 14 and 15 through the diode 23 to the load impedance 26. For large positive signals the forward impedance of the diode 23 is insignificant, while for low positive signal levels the impedance of the diode 23 is very high and conduction is entirely through the resistor 30. The value of the resistor 30, therefore, will be significant only for small signals. There is, therefore, a transitional gain coefficient from the crossover point to the point that forward conduction is initiated through the diode 23. If resistor 30 is chosen to be equal to resistor 31 and each are equal to one half the load impedance 26, the gain of the amplifier for signals too low to initiate forward conduction of the diode 23 has been found to be ⅔ of the gain for signals that do initiate forward conduction. The resulting transitional gain coefficient produces less crossover distortion than exists in amplifiers heretofore known.

To compensate for the slight crossover distortion due to the transitional gain coefficient, a negative feedback network 46 may be provided for feeding back signals from across the load impedance 26 to the input of the preamplifier 38. Since negative feedback networks are usually provided in amplifiers of this type, the addition of the network 46 to compensate for the slight distortion due to the transitional gain coefficient does not constitute additional circuitry over known amplifiers.

An amplifier exemplifying the invention was constructed and tested. In this amplifier the resistors 30 and 31 were chosen to be five ohms each; the load impedance 26 was 10 ohms; and the resistors 33 and 34 were chosen to be 1000 ohms each; the positive power supply bus 16 was held at a positive potential of 45 volts while the negative power supply bus 19 was held at a negative 45 volts. The amplifier was biased for Class B operation and exhibited crossover distortion of less than 0.02% at all power levels.

While an embodiment of the invention has been shown and described, further embodiments or combinations of those described herein will be apparent.

What is claimed is:

1. In a transistorized push-pull power amplifier having first and second complementary power output stages, the combination of:

(a) a power supply including a positive bus and a negative bus, and first and second power sources connected in additive series between said busses;

(b) thermal stabilizing means serially connected with said stages between said power supply busses;

(c) means for symmetrically connecting a load impedance between said stabilizing means and said power sources;

(d) first current conduction means connected between said first stage and said negative bus for supplying quiescent current to said first stage independent of said stabilizing means; and (e) second current conduction means connected between said second stage and said positive bus for supplying quiescent current to said second stage independent of said stabilizing means.

2. The combination of claim 1, further including bias means for setting the quiescent voltage drop across said stabilizing means at a level less than the current conduction threshold level of said stabilizing means in the presence of the summation of maximum quiescent thermal voltage variations of said first and second stages and said stabilizing means.

3. The combination of claim 2, wherein said bias means is operable for establishing a reverse bias across said stabilizing means.

4. The combination of claim 2, wherein said bias means includes an adjustable impedance that is smoothly adjustable over a range of settings.

5. The combination of claim 2, wherein said bias means includes an element having a negative temperature coefficient for thermally tracking said first and second transistorized power output stages and said stabilizing means.

6. The combination of claim 1, further including bypass means connected across said stabilizing means for conducting load current during crossover operation of said amplifier.

7. The combination of claim 6 wherein said stabilizing means is a pair of diodes serially connected between said first and second stages, said bypass means is a pair of resistors each connected respectively across one of said diodes, and said first and second current conduction means are resistors for supplying quiescent current independently to respective first and second stages.

8. The combination of claim 7, wherein said first and second stages are emitter follower stages, each having a driving transistor bootstrapped across the base and collector of a power output transistor, and said first current conduction means is connected to the emitter of the driving transistor and the collector of the power output transistor of said first stage, and said second current conduction means is connected to the emitter of the driving transistor and the collector of the power output transistor of said second stage.

9. The combination of claim 8, wherein the driving transistor and output transistor of said first stage are NPN and PNP transistors respectively, and the driving transistor and output transistor of said second stage are PNP and NPN transistors respectively.

10. The combination of claim 1, further including a negative feedback network for conducting output signals inversely from the output of said first and second stages to the inputs of said stages.

References Cited

UNITED STATES PATENTS

| | | | |
|---|---|---|---|
| 2,851,542 | 9/1958 | Lohman | 330—17 X |
| 2,860,193 | 11/1958 | Lindsay | 330—13 |
| 2,863,008 | 12/1958 | Keonjian | 330—13 |

ROY LAKE, Primary Examiner

S. H. GRIMM, Assistant Examiner

U.S. Cl. X.R.

330—15, 17, 24, 28